(12) United States Patent
Takao

(10) Patent No.: US 7,692,260 B2
(45) Date of Patent: Apr. 6, 2010

(54) SOLID STATE IMAGING DEVICE AND MANUFACTURING METHOD THEREOF

(75) Inventor: Hiroaki Takao, Miyagi (JP)

(73) Assignee: Fujifilm Corporation, Tokyo (JP)

(*) Notice: Subject to any disclaimer, the term of this patent is extended or adjusted under 35 U.S.C. 154(b) by 189 days.

(21) Appl. No.: 11/907,791

(22) Filed: Oct. 17, 2007

(65) Prior Publication Data

US 2008/0093696 A1   Apr. 24, 2008

(30) Foreign Application Priority Data

Oct. 18, 2006   (JP)   ............................. 2006-283733

(51) Int. Cl.
*H01L 31/0232* (2006.01)
(52) U.S. Cl. ................ 257/432; 257/294; 257/E31.127
(58) Field of Classification Search ................ 257/294, 257/432, E31.127
See application file for complete search history.

(56) References Cited

U.S. PATENT DOCUMENTS

| 5,118,924 | A  | * | 6/1992  | Mehra et al. ................ 257/659 |
| 6,586,811 | B2 |   | 7/2003  | Sekine et al. |
| 7,122,132 | B2 | * | 10/2006 | Morita et al. ............... 252/502 |
| 2006/0279949 | A1 | * | 12/2006 | Shin et al. ................... 362/236 |

FOREIGN PATENT DOCUMENTS

JP   2002-83948 A   3/2002

* cited by examiner

*Primary Examiner*—Allan R. Wilson
(74) *Attorney, Agent, or Firm*—Birch, Stewart, Kolasch & Birch, LLP (57) ABSTRACT

A light shielding film, an insulating layer, a planarizing layer, and a color filter are formed consecutively on a semiconductor substrate having plural photodiodes in a matrix arrangement. A transparent conductive film is formed on the color filter, and micro-lenses are formed directly on the conductive film such that they reside above each photodiode. Static charges on a surface of each micro-lens are discharged to the conductive film, and static charge buildup on the micro-lenses is therefore prevented.

7 Claims, 7 Drawing Sheets

SOLID STATE IMAGING DEVICE AND MANUFACTURING METHOD THEREOF

FIELD OF THE INVENTION

The present invention relates to a solid state imaging device and a manufacturing method thereof.

BACKGROUND OF THE INVENTION

For now, one of the most popular tools are digital cameras which convert an image into digital image data and store the data in an internal memory, a memory card, and such recording media. The digital cameras are equipped with a solid state imaging device which converts an image into an electric signal. The solid state imaging device includes a semiconductor substrate with plural photodiodes in a matrix arrangement, a light shielding film with openings above each photodiode, and micro-lenses formed above each opening. A light beam coming through an imaging optical system is converged by the micro-lens to pass through the opening, and received by the photodiode which constitutes a pixel.

The micro-lenses are generally made of a highly insulating polymer resin. Therefore, static charges tend to build up on a surface of the micro-lens, attracting foreign matter to the lens surface. Since a top surface of the solid state imaging device has bumps standing out in the shape of the micro-lenses, it is difficult to remove the foreign matter once it is adsorbed. Also, the bumps get smaller as pixels become smaller, and removal of the foreign matter will be more difficult. In view of this, with the aim to prevent adsorption of foreign matter, there is proposed a method to cover each micro-lens with a conductive film to prevent static charge buildup on the micro-lens surface (see, for example, U.S. Pat. No. 6,586,811 corresponding to Japanese Patent Laid-open Publication No. 2002-83948).

However, when introduced to cover the micro-lens as described above, this conductive film may vary in thickness and possibly changes the shape of the micro-lens. As a result, an optical characteristic of the micro-lens changes, and quality and yield of the solid state imaging devices are lowered.

SUMMARY OF THE INVENTION

In view of the foregoing, an object of the present invention is to provide a solid state imaging device, and a manufacturing method thereof, capable of preventing static charge buildup on surfaces of micro-lenses without changing an optical characteristic of these micro-lenses.

In order to achieve the above and other objects, a solid state imaging device according to the present invention includes a transparent first conductive film, on which a plurality of micro-lenses are formed directly. These micro-lenses are located above light receiving elements arranged on a semiconductor substrate.

In another preferred embodiment of the present invention, a surface of each micro-lens is covered with a transparent second conductive film. This second conductive film is electrically connected to the first conductive film.

The first conductive film is preferably connected to a ground. Also, the first and the second conductive films are preferably a metal thin film made of conductive metal oxide or gold. Alternatively, the first and the second conductive films may be a carbon-based film.

A manufacturing method of the solid state imaging device according to the present invention includes a first conductive film forming step, a resin layer forming step, a resist pattern forming step, a heating step, and an overall-etching step. In the first conductive film forming step, a transparent first conductive film is formed above light receiving elements arranged on a semiconductor substrate. In the resin layer forming step, an optical material resin layer is formed on the first conductive film. In the resist pattern forming step, a resist pattern in a shape of the micro-lenses are formed by depositing, exposing, and developing a resist on the resin layer. In the heating step, the resist pattern is heated to melt into a shape of plural convex lenses. In the overall-etching step, the resist pattern and the resin layer are overall-etched, using the resist pattern as a mask, until the resist pattern is removed and the resin layer is shaped into the micro-lenses.

It is preferred to provide a second conductive film forming step after the overall etching step. Formed in this second conductive film forming step is a second conductive film which covers a surface of each micro-lens and is electrically connected to the first conductive film. Additionally, the resist preferably has the same etching rate as the resin layer.

According to the present invention, the micro-lenses are formed directly on the transparent first conductive film, and the static charges on the surface of each micro-lens are discharged to the first conductive film. It is therefore possible to prevent static charge buildup on the micro-lenses without changing the optical characteristic (shape) of the micro-lens. This leads to prevent quality loss and yield loss of the solid state imaging devices due to the optical characteristic change in the micro-lenses or adsorption of foreign matter to the micro-lenses.

When each micro-lens is covered with the second conductive film, the static charges on the micro-lens surface are certainly discharged to the first conductive film, and the static charge buildup on the micro-lens surface is prevented more certainly.

Since the first conductive film is connected to a ground, the static charges on the micro-lens surface can be discharged to a ground (GND) through the first conductive film. The static charge buildup on the micro-lens surface is therefore prevented still more certainly.

In the manufacturing method of the solid state imaging device according to the present invention, the resin layer and the resist pattern are formed consecutively on the first conductive film, and then applied to the overall-etching (etch-back) process with using the resist pattern as a mask so as to form the micro-lenses. The micro-lenses are formed directly on the first conductive film in this manner, and the static charge buildup on the micro-lens surface is therefore prevented. Additionally, it is possible to make clearances between the micro-lenses, and to adjust these clearances to a desired size.

Since the resist and the resin layer have the same etching rate, the resin layer is etched into the exact shape of the resist pattern. Accordingly, the micro-lens of a desired shape is easily formed.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENTS

Figure 1:
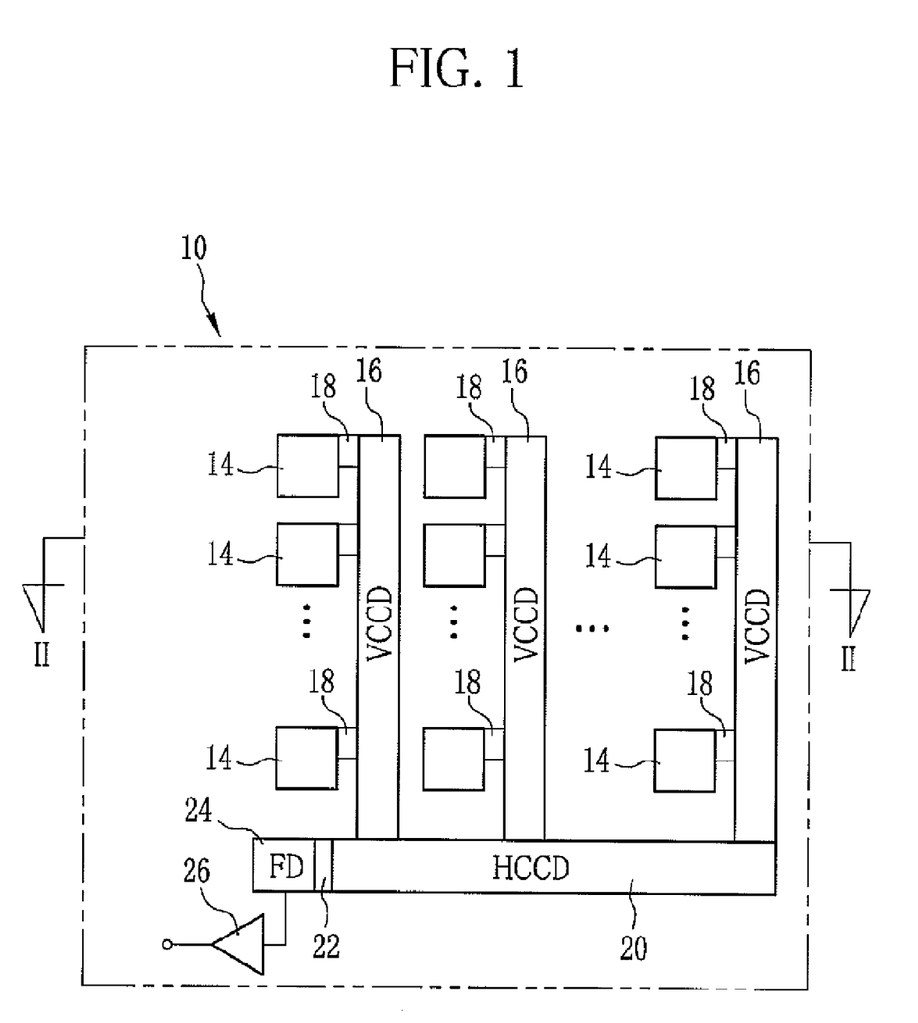
FIG. 1 is a schematic view of a solid state imaging device according to the present invention.

Referring to FIG. 1, a solid state imaging device 10 is an interline transfer CCD which includes plural photodiodes (light receiving elements) 14 in two dimensional matrix arrangement, vertical transfer CCDs (VCCDs) 16 along each column of the photodiodes 14, transfer gates (TG) 18 connecting each photodiode 14 to the VCCD 16, a horizontal transfer CCD (HCCD) 20 connected to output terminals of all the VCCDs 16, an output gate (OG) 22 and a floating diffusion (FD) 24 at an output terminal of the HCCD 20, and a source-follower amplifier circuit 26 connected to the FD 24.

The photodiode 14 converts incident light into an electrical signal, and stores a signal charge equivalent to an amount of the incident light. The signal charge of the photodiode 14 is then transferred through the TG 18 to the VCCD 16. In the VCCD 16, the signal charge is shifted, one line at a time, to the HCCD 20. The HCCD 20 horizontally transfers the signal charges of the same row (horizontal line) to the OG 22. The OG 22 transfers the signal charges to the FD 24 on a pixel basis. The FD 24 converts the signal charge from the OG 22 into a voltage signal. The amplifier circuit 26 amplifies and outputs this voltage signal as an image signal Vout.

Figure 2:
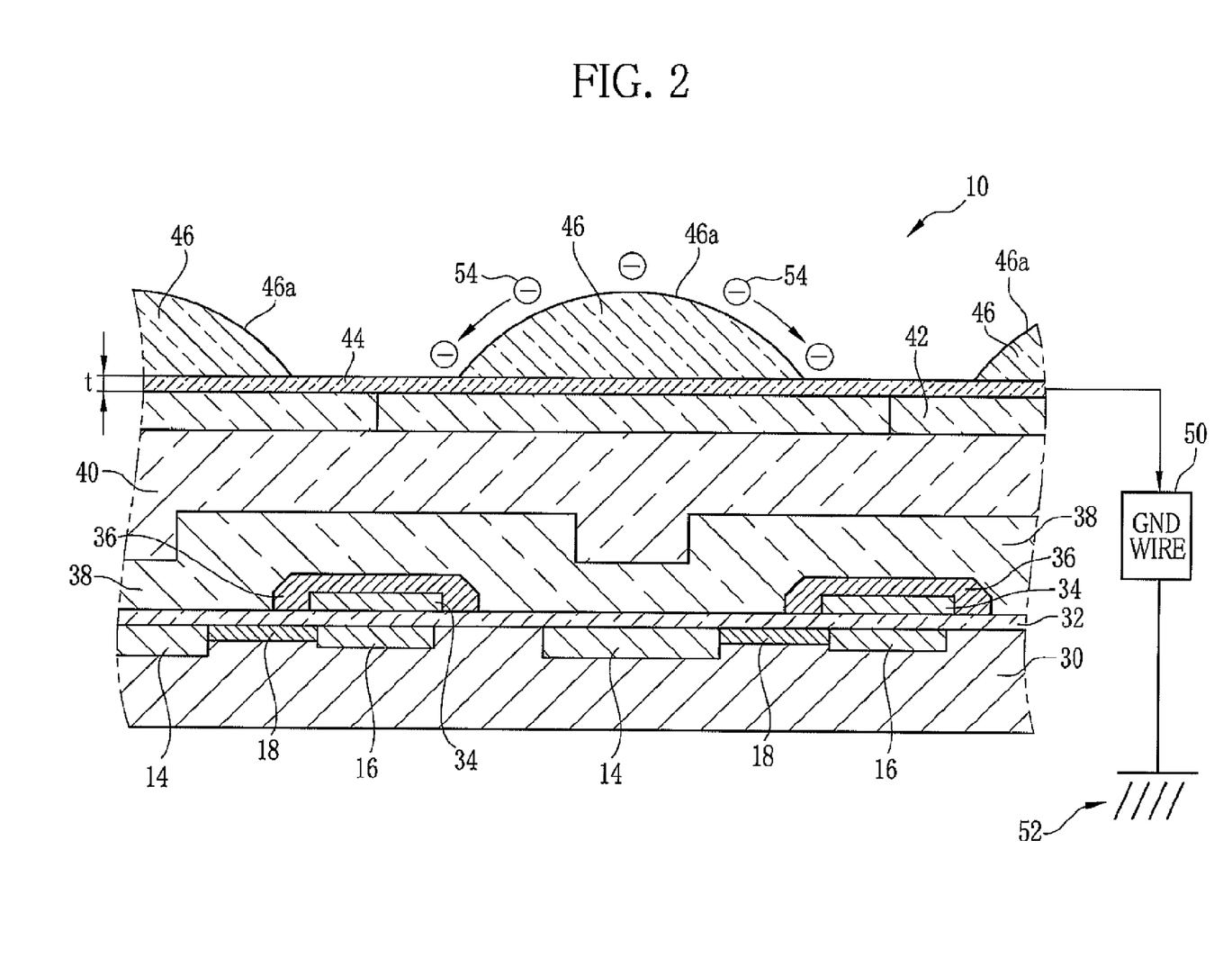
FIG. 2 is a cross section view along a line II-II of FIG. 1.

As shown in FIG. 2, the solid state imaging device 10 has a semiconductor substrate 30 on which the photodiodes 14 and the VCCDs 16 are formed. Disposed above each VCCD 16, across a transparent insulating film 32, are transfer electrodes 34. By controlling a voltage to the transfer electrode 34, the signal charge of the photodiode 14 is transferred through the TG 18 to the VCCD 16 and then shifted vertically to the HCCD 20. These transfer electrodes 34 are made of poly-silicon by, for example, a dry etching method. The insulating film 32 is made of $SiO_2$ (silicon dioxide) by, for example, a thermal oxidation method or a CVD (Chemical Vapor Deposition) method.

Further provided above the semiconductor substrate 30 are a light shielding film 36, an insulating layer 38, a planarizing layer 40, a color filter 42, a conductive film 44, and an array of micro-lenses 46. Made of aluminum or such metal by a sputtering method, the light shielding film 36 covers to protect the transfer electrodes 34 from light while it provides openings above each photodiode 14. The insulating layer 38 is made of such a transparent insulating material as, for example, BPSG (Boron Phosphorous Silicate Glass), and covers over the light shielding film 36 and the insulating film 32.

The planarizing layer 40 is a transparent layer of, for example, BPSG, and has a flat top surface. Lying on this top surface is the color filter 42 which has color regions of, for example, three colors (R, G, and B) or four colors (R, G, B, and neutral color) in a mosaic arrangement. These color regions are created by depositing and patterning a color resist material with corresponding pigments.

The conductive film 44 is a transparent and conductive thin film formed on the color filter 42. The conductive film 44 is either a metal thin film made by, for example, the CVD method or the sputtering method, or a carbon-based film. This metal thin film may be either of conductive metal oxide such as tin oxide, indium oxide, ITO (indium tin oxide), zinc oxide, CTO (cadmium tin oxide), and iridium oxide, or gold. The carbon-based film may be a diamond-like carbon film or the like.

While it depends on a film material, a thickness T of the conductive film 44 is adjusted in the range of 1-200 nm so that it will transmit light. Especially, in order to prevent reflection of the light, the thickness T is preferably in the range of 1-20 nm, and more preferably in the range of 1-10 nm. Note that an experiment may be conducted beforehand to find out an optimum thickness T of the conductive film 44 for each film material.

The conductive film 44 is electrically connected to a grounding (GND) wire 50 provided in the solid state imaging device 10. The GND wire 50 is connected to a ground (GND) 52, and thereby the conductive film 44 is connected to a ground.

The micro-lenses 46 are a convex lens formed directly on the conductive film 44 and located above each photodiode 14. The light beam converged by micro-lens 46 strikes the photodiode 14. The micro-lenses 46 are made of such a highly insulating polymer resin material (optical resin) as novolac resin.

The polymer resin material is charged easily, and static charges 54 will build up on a surface 46a of each micro-lens 46. However, since the micro-lenses 46 are formed directly on the conductive film 44, the static charges 54 are discharged to the GND 52 through the conductive film 44 and the GND wire 50. Accordingly, the static charge buildup is prevented on each micro-lens 46.

Next, with reference to FIG. 3 to FIG. 10, a manufacturing process of the solid state imaging device 10 is explained. In this embodiment, the color filter 42 and the underlying structures are formed by a common manufacturing process, and the detailed explanation thereof is omitted.

Figure 3:
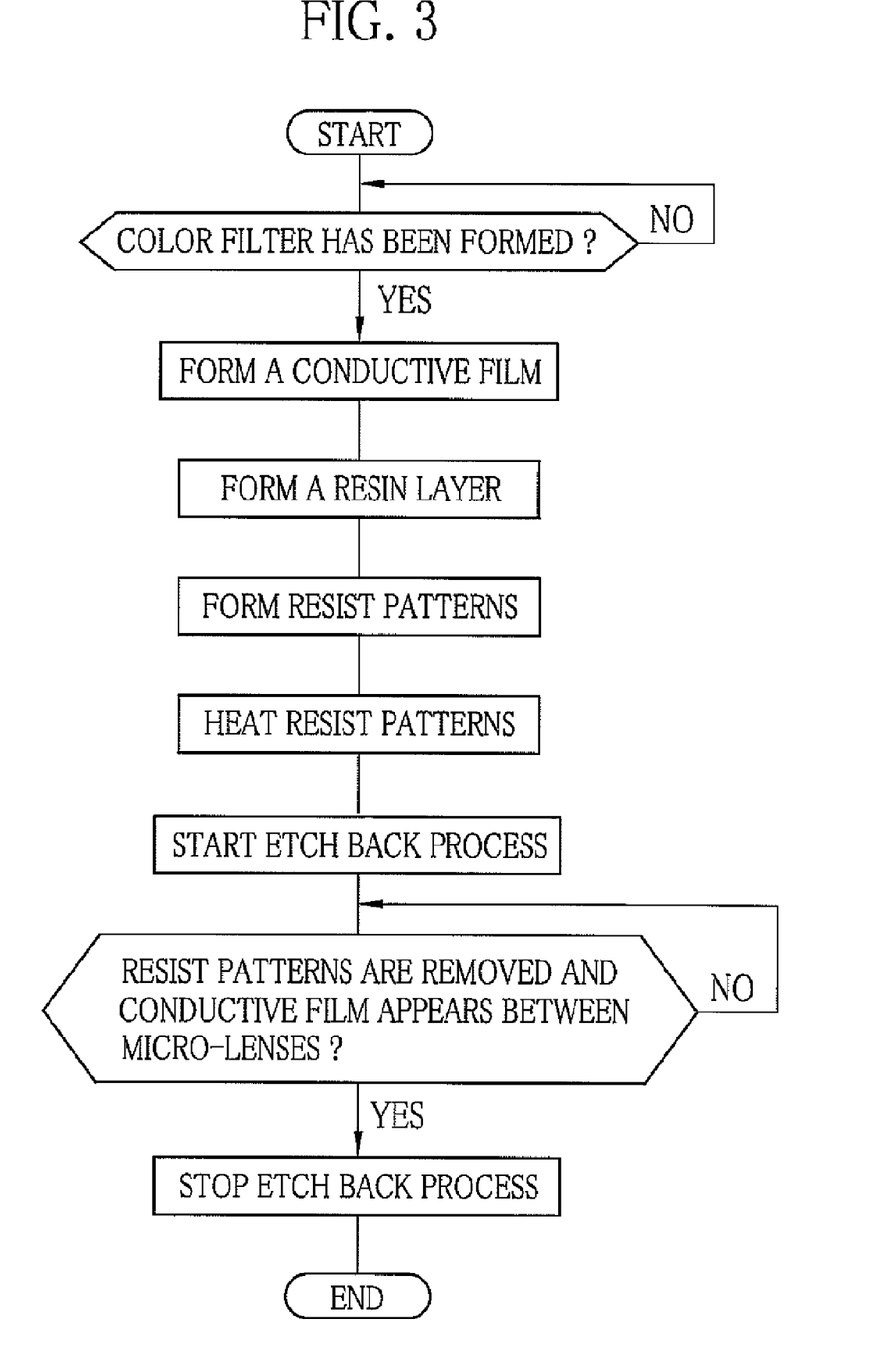
FIG. 3 is a flow chart of a process for manufacturing the solid state imaging device.
Figure 4:
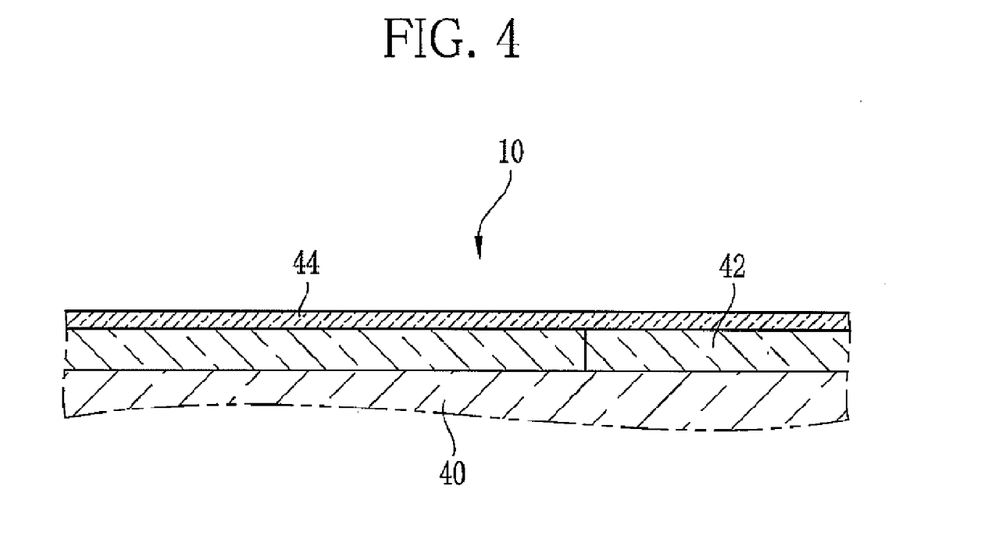
FIG. 4 is an explanatory cross section view of the solid state imaging device when a conductive film is formed.
Figure 5:
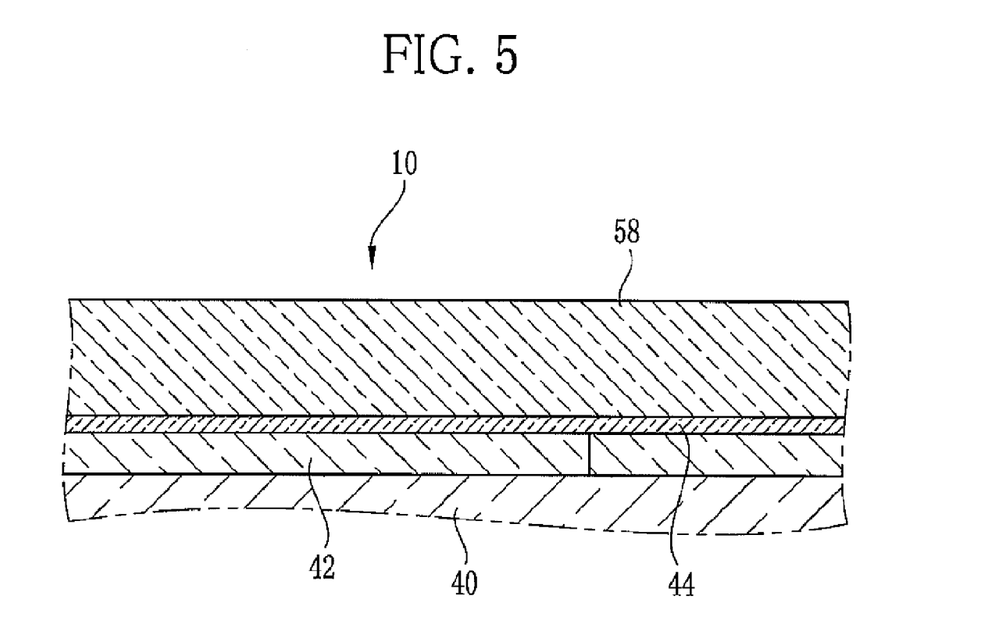
FIG. 5 is an explanatory cross section view of the solid state imaging device when a resin layer is formed.

As shown in FIG. 3 and FIG. 4, the conductive film 44 of, for example, ITO is formed on a top surface of the color filter 42, using a CVD machine or a sputtering machine (both not shown). Then, as shown in FIG. 5, novolac resin (optical resin) is deposited on the conductive film 44 and cured into a resin layer 58, i.e., the material of the micro-lenses 46, using a resin depositing machine and a heating machine (both not shown).

Figure 6:
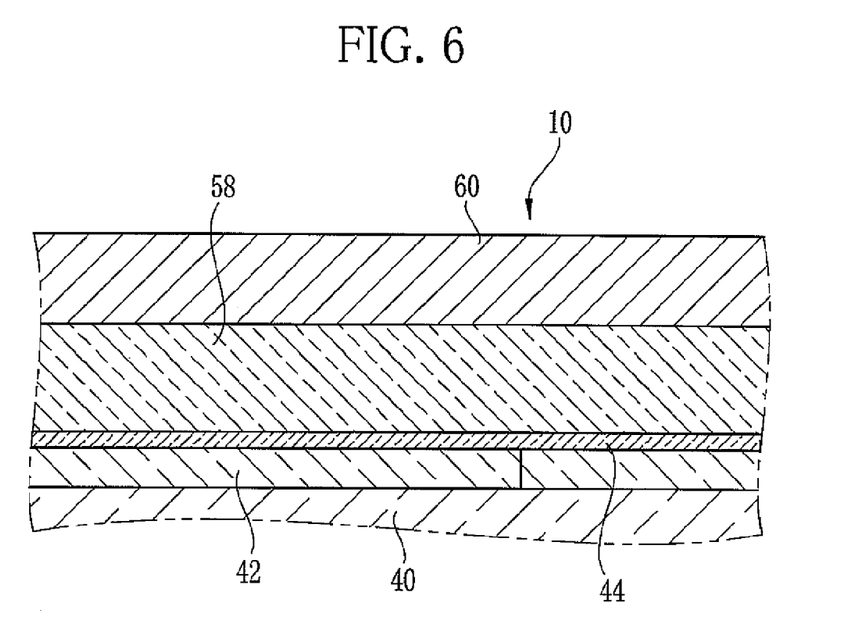
FIG. 6 is an explanatory cross section view of the solid state imaging device when a resist is deposited.

As shown in FIG. 6, a resist 60 is deposited on the resin layer 58 using a resist depositing machine (not shown). The resist 60 is selected to have the same etching rate as the resin layer 58 (micro-lenses 46). For example, when the resin layer 58 is made of the novolac resin, the resist 60 may be a GKR 5315 (a product name of FUJIFILM Electronic Materials Co., Ltd.).

Figure 7:
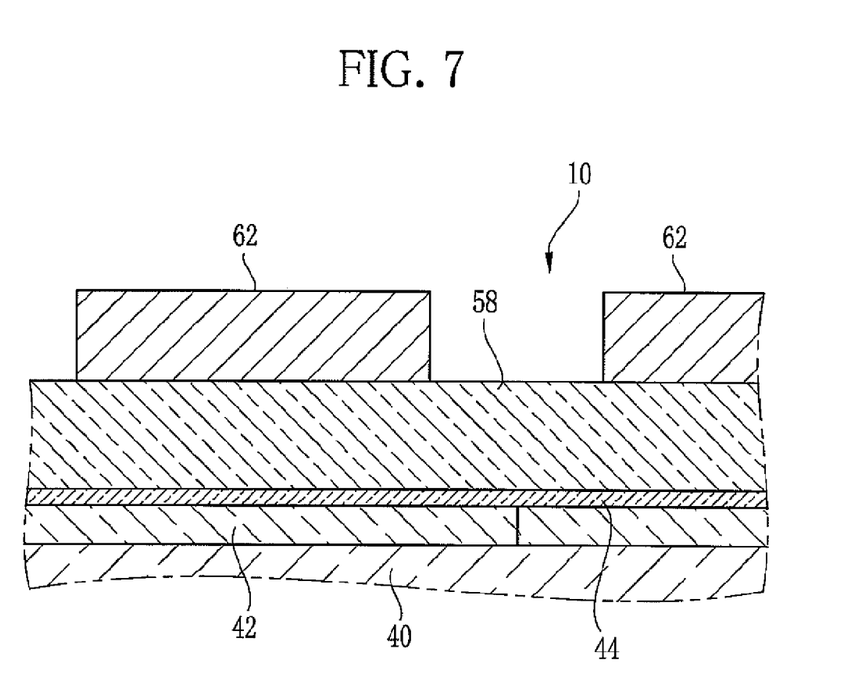
FIG. 7 is an explanatory cross section view of the solid state imaging device when a resist pattern is formed.

Thereafter, as shown in FIG. 7, the resist 60 is exposed and developed, by an exposure/development machine (not shown), into resist patterns 62 of rectangular cross section each in the size of the micro-lens 46. More specifically, the resist 60 is firstly exposed with masks placed on the positions of the micro-lenses 46. The unnecessary portions of the resist 60 is then removed by etching, and the resist patterns 62 appear at the positions of the micro-lenses 46.

Figure 8:
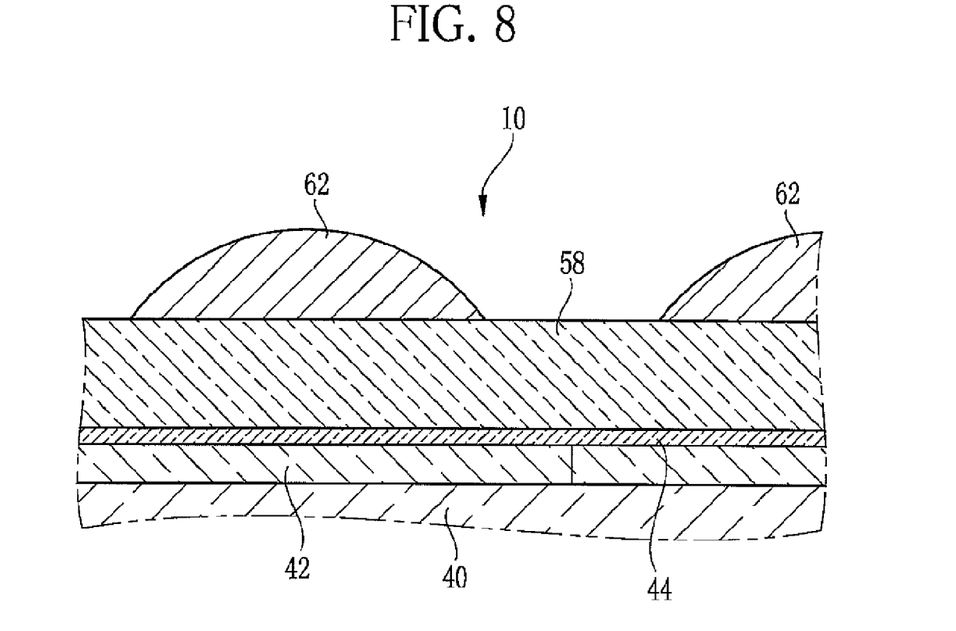
FIG. 8 is an explanatory cross section view of the solid state imaging device with the resist pattern after heat treatment.

The resist patterns 62 are heated with a heat machine (not shown). These resist patterns 62 are melted and, due to surface tension thereof, change to a convex lens shape (substantially a hemispheric shape) as shown in FIG. 8.

Figure 9:
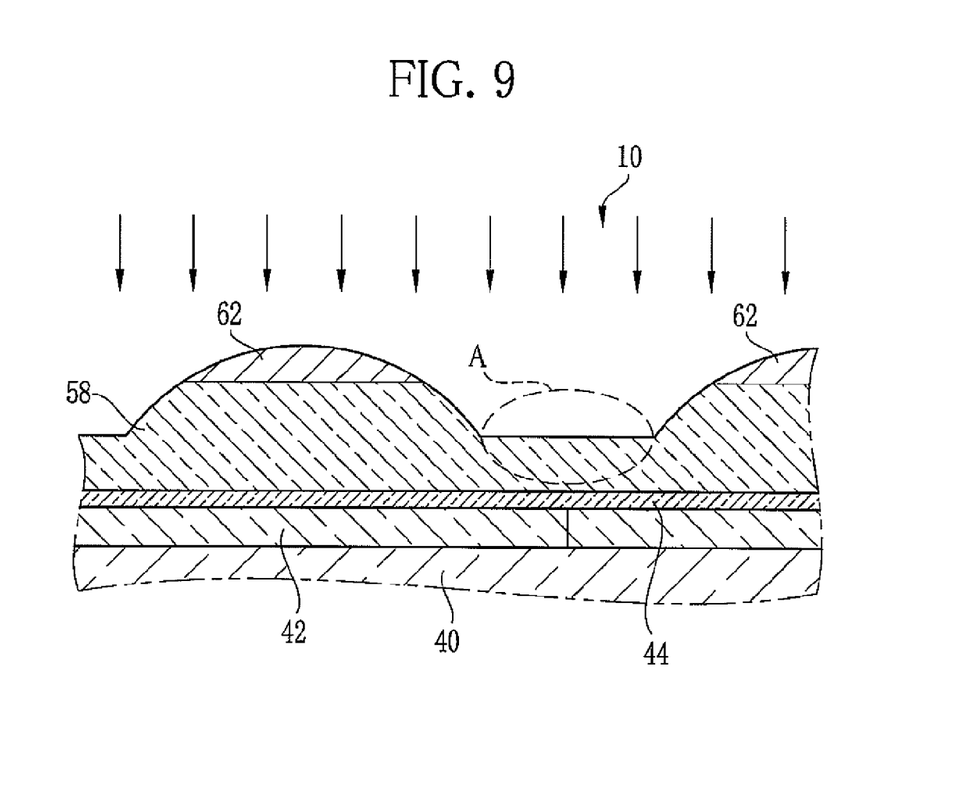
FIG. 9 is an explanatory cross section view of the solid state imaging device during an etch-back process.

Conducted thereafter is an etch-back process, as shown in FIG. 9, where the cooled and cured resist patterns 62 and the resin layer 58 are both overall-etched in the depth direction (a direction of arrows) using an anisotropic etching machine or the like, while the resist patterns 62 are used as a mask. This etch-back process is stopped when the resist patterns 62 are completely removed and the conductive film 44 appears between the adjoining micro-lenses 46 (the area indicated with a dashed line A in the drawing). Since the resin layer 58 and the resist pattern 62 are adjusted to an appropriate thickness, the conductive film 44 does not appear between the micro-lenses 46 before the resist patterns 62 are removed completely.

Figure 10:
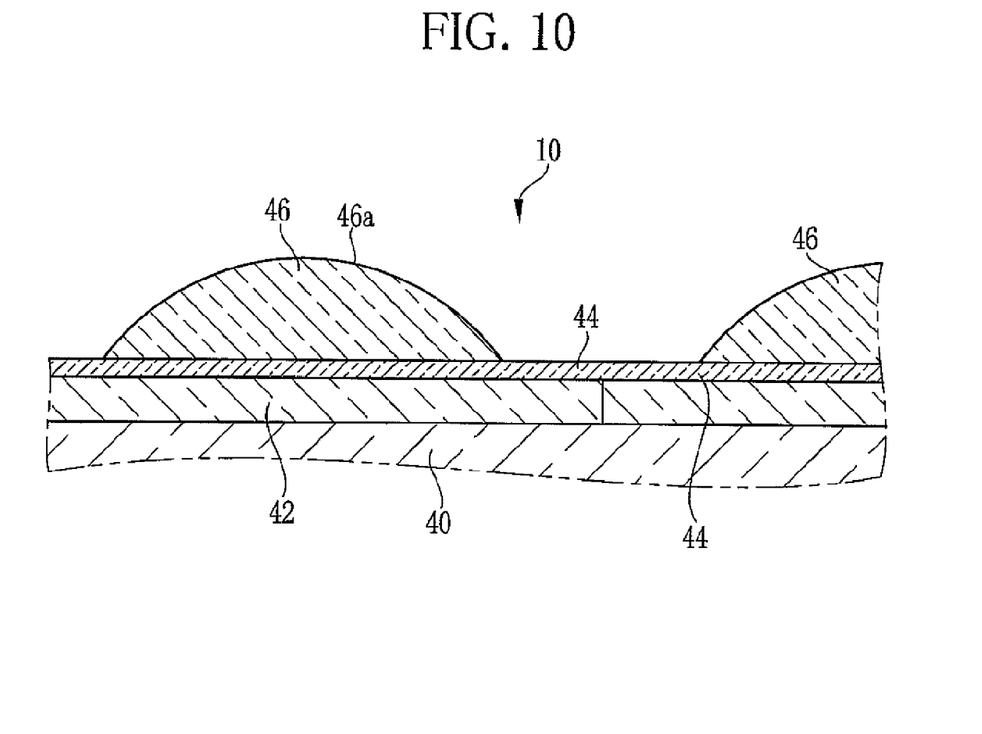
FIG. 10 is an explanatory cross section view of the solid state imaging device after the etch-back process.

The resin layer 58 and the resist pattern 62 have the same etching rate. Accordingly, when the etch-back process is finished, the shape of the resist pattern 62 is transferred to the resin layer 58 as shown in FIG. 10, and the micro-lenses 46 are formed on the conductive film 44. In this process, it will be difficult to make the micro-lenses 46 into a desired shape if the resin layer 58 and the resist 60 have different etching rates.

As stated above, the micro-lenses 46 are directly formed on the conductive film 44, and the bottom surface of each micro-lens 46 comes into contact with the conductive film 44. Since the static charges 54 (see, FIG. 2) on the surface 46a of each micro-lens 46 are discharged to the conductive film 44, it is possible to prevent the static charge buildup on the surface 46a without changing the optical characteristic (shape) of the micro-lenses 46. This leads to prevent adsorption of foreign matter to the surface 46a of each micro-lens 46, reducing the quality loss and yield loss due to the optical characteristic change in the micro-lenses 46 or adsorption of foreign matter to the micro-lenses 46.

Also, the conductive film 44 is connected to a ground, and the static charges 54 on the surface 46a are discharged to the GND 52. It is therefore possible to prevent the static charge buildup on the surface 46a of each micro-lens 46 more certainly.

Since the micro-lenses 46 are formed by firstly forming and then etching the resin layer 58 and the resist pattern on the conductive film 44, clearances can be made between the adjoining micro-lenses 46. By changing the seize of the resist patterns 62, these clearance can be adjusted to a desired size.

While the above embodiment prevents the static charge buildup on the surface 46a without change in optical characteristic (shape) of the micro-lens 46, the present invention is not limited to this. For example, without affecting the optical characteristic (shape) of the micro-lens 46, the surface 46a of each micro-lens 46 may be covered with a conductive coating film 66 as shown with a solid state imaging device 65 in FIG. 11.

Figure 11:
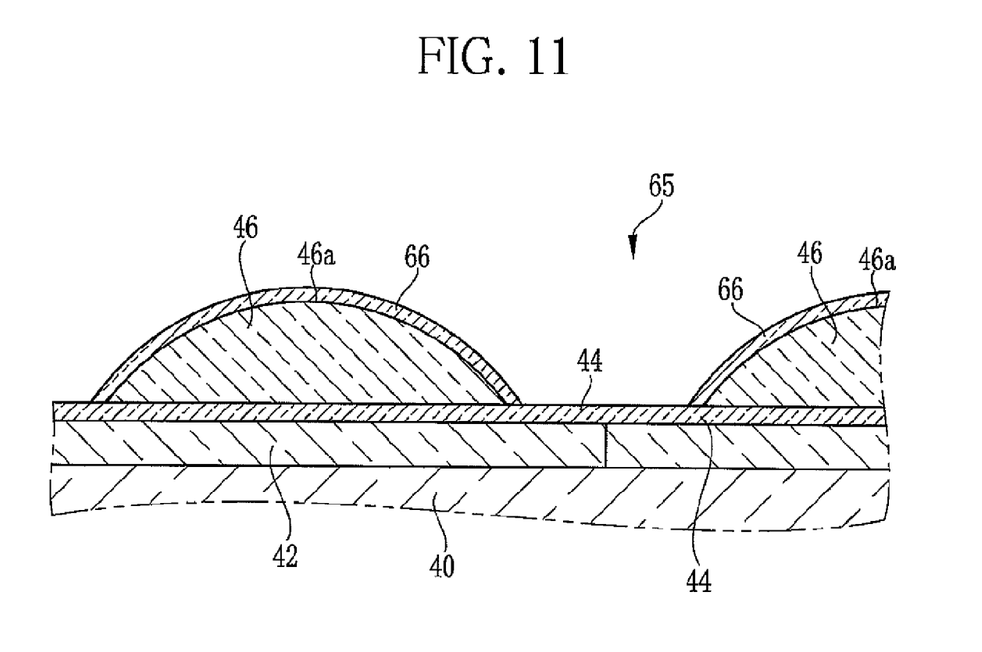
FIG. 11 is a cross section view of a solid state imaging device according to another embodiment of the present invention, where micro-lenses are covered with additional conductive films.

The conductive coating films 66 are made of the same material as the conductive film 44 by the CVD method, the sputtering method or the like. Similar to the conductive film 44, a thickness of the conductive coating films 66 is in the range of 1-200 nm. Especially, in order to prevent reflection of the light, the thickness is preferably in the range of 1-20 nm, and more preferably in the range of 1-10 nm. Additionally, an edge of the conductive coating film 66 makes contact with the top surface of the conductive film 44, establishing electrical connection to the conductive film 44. Thereby, the static charges 54 (see, FIG. 2) on the surface 46a of each micro-lens 46 are discharged to the conductive film 44 (and then to the GND 52) through the conductive coating film 66.

It may also be possible not to use the conductive film 44 but use only the conductive coating films 66 to cover over the surface 46a of each micro-lens 46 and the color filter 42. In this case, the conductive coating films 66 are connected to a ground.

Although the micro-lenses 46 are formed by firstly forming and then etching the resin layer 58 and the resist pattern on the conductive film 44 in the above embodiments, the present invention is not limited to this. Additionally, the clearances are not necessarily formed, while they are formed between the adjoining micro-lenses 46 in the above embodiments.

Additionally, in the above embodiments, there are the light shielding film 36, the insulating layer 38, the planarizing layer 40, and the color filter 42 between the semiconductor substrate 30 and the conductive film 44 of the solid state imaging device 10. However, the layer configuration is not limited to this, as long as the micro-lenses 46 are formed directly on the conductive film 44.

The photodiodes 14 may be arranged not only in a matrix, but also in a zigzag arrangement or a honeycomb arrangement.

While the above embodiments are described with the interline transfer CCD image sensor, the present invention is applicable to CMOS image sensors and other solid state imaging devices.

The solid state imaging device of the present invention can be used in electronic endoscopes and such medical instruments, as well as in such imaging apparatus as the digital cameras and camera phones.

Although the present invention has been fully described by the way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A solid state imaging device having a semiconductor substrate with light receiving elements arranged thereon, and a plurality of micro-lenses above each said light receiving element, comprising:
    a transparent first conductive film, on which said micro-lenses are formed directly, said transparent first conductive film being disposed between said light receiving elements and said micro-lenses.

2. The solid state imaging device of claim 1, wherein said first conductive film is connected to a ground.

3. The solid state imaging device of claim 1, wherein said first conductive film is a metal thin film made of conductive metal oxide or gold.

4. The solid state imaging device of claim 1, wherein said first conductive film is a carbon-based film.

5. A solid state imaging device having a semiconductor substrate with light receiving elements arranged thereon, and a plurality of micro-lenses above each said light receiving element, comprising:
    a transparent first conductive film, on which said micro-lenses are formed directly; and
    a transparent second conductive film for covering a surface of each said micro-lens, said second conductive film is electrically connected to said first conductive film.

6. The solid state imaging device of claim 5, wherein said second conductive film is a metal thin film made of conductive metal oxide or gold.

7. The solid state imaging device of claim 5, wherein said second conductive film is a carbon-based film.

* * * * *